United States Patent [19]

Moriya et al.

[11] 4,160,243
[45] Jul. 3, 1979

[54] ASYNCHRONOUS REVERSIBLE ANALOG TO DIGITAL CONVERTER

[75] Inventors: Takao Moriya, Yokohama; Masao Yamasawa; Hirohisa Gambe, both of Tokyo, all of Japan

[73] Assignee: Fujitsu Limited, Japan

[21] Appl. No.: 925,787

[22] Filed: Jul. 18, 1978

Related U.S. Application Data

[63] Continuation-in-part of Ser. No. 727,341, Sep. 28, 1976, abandoned.

[51] Int. Cl.² .............................................. H03K 13/02
[52] U.S. Cl. ........................ 340/347 C; 340/347 AD; 340/347 DA
[58] Field of Search ....... 340/347 C, 347 M, 347 AD, 340/347 DA; 179/15 A, 15 BA

[56] References Cited

U.S. PATENT DOCUMENTS

| | | |
|---|---|---|
| 2,950,348 | 8/1960 | Mayer ............................. 340/347 C |
| 4,034,294 | 7/1977 | Dalley ........................... 340/347 AD |
| 4,056,820 | 11/1977 | Höfer ........................... 340/347 AD |

*Primary Examiner*—Charles D. Miller
*Attorney, Agent, or Firm*—Staas & Halsey

[57] ABSTRACT

An asynchronous signal processing circuit device having an A-D converter and a D-A converter in which a single ladder voltage generating circuit is commonly or jointly used by changing over a multiplexer during both the A-D and the D-A conversion processing. The asynchronous signal processing circuit device according to the present invention further comprises an interrupt signal generating circuit which produces an inhibit signal so as to provide a predetermined inhibit period during which the interruption by the second signal processing circuit to the first signal processing circuit is inhibited, thus preventing a misoperation of the asynchronous signal processing circuit device at the time of switching over the converters.

10 Claims, 19 Drawing Figures

ASYNCHRONOUS REVERSIBLE ANALOG TO DIGITAL CONVERTER

REFERENCE TO RELATED APPLICATION

This application is a continuation-in-part of U.S. application Ser. No. 727,341 filed on Sept. 28, 1976 now abandoned, assigned to the assignee of the present invention.

BACKGROUND OF THE INVENTION

The present invention relates to an asynchronous signal processing circuit, and more particularly, to an asynchronous signal processing circuit in which an encoder, which carries out the analog-digital conversion in synchronism with a clock signal supplied together with an analog signal input, is integrally formed with a decoder, which executes the digital-analog conversion in synchronism with another clock signal supplied together with a digital signal input. Furthermore, a ladder voltage generator circuit is jointly used by said encoder and decoder, while a predetermined inhibit period is set up to coordinate the operation between said encoder and decoder at the time of changing over said ladder voltage generator circuit for use by said encoder or decoder.

SUMMARY OF THE INVENTION

In the asynchronous signal processing circuit according to the present invention, the ladder voltage generator in the encoder for encoding analog-digital (A-D) conversion and the generator in the decoder for digital-analog (D-A) conversion are united into a single generator enabling the joint use of said ladder generator.

In general, the decoder side has a higher priority of use of the ladder voltage generator than does the encoder. Accordingly, when there is a request or a requirement for decoding during the execution of the encoding function, said ladder voltage generator is changed over for use in the decoding function to be performed. However, there exists a technical difficulty when said ladder voltage generator is changed over in an undesirable manner during the execution of the encoding function. More particularly, when the ladder voltage generator is changed over after the start of the operation of comparing the level of an input analog signal with that of said ladder voltage generator circuit output signal, and after the start of the operation of counting the number of loop processing cycles necessary to achieve processing results, said analog-digital conversion operation cannot be resumed at a later time due to non-synchronism.

Therefore, a main purpose of the present invention is to solve the problems mentioned above by allotting at least one marginal time slot to the sampling period of the A-D/D-A converting times so as to adjust a phase difference between the A-D converting and D-A converting operations. Another purpose of the invention is to coordinate the operation of the decoder by setting up an interruption-inhibit period.

The above object will be attained by an asynchronous signal processing circuit, comprising a first signal processing circuit, and second and third signal processing circuits which commonly utilize, on a time sharing basis, said first signal processing circuit, and which are independent of each other, the occupancy of said first circuit by said third circuit being given priority with respect to that of said first circuit by said second circuit. There is set up an interrupt-inhibit period which starts earlier than the rise point of a clock pulse in said second signal processing circuit by more than a time t1 required for said clock pulse to be inhibited with the interrupt from the side of said third signal processing circuit, and which ends later than the rise point of said clock pulse in said second signal processing circuit by more than a time t2 required for the establishment of the results of a processing operation executed corresponding to said clock pulse, thereby inhibiting said third signal processing circuit and defining an interrupt for utilizing said first signal processing circuit.

The present invention will be better understood from the description made, by way of example, of one embodiment in which the encoder/decoder is constructed for an asynchronous signal processing circuit according to the present invention, with reference to the accompanying drawings.

DETAILED DESCRIPTION OF THE PREFERRED EMBODIMENT

Figure 1:
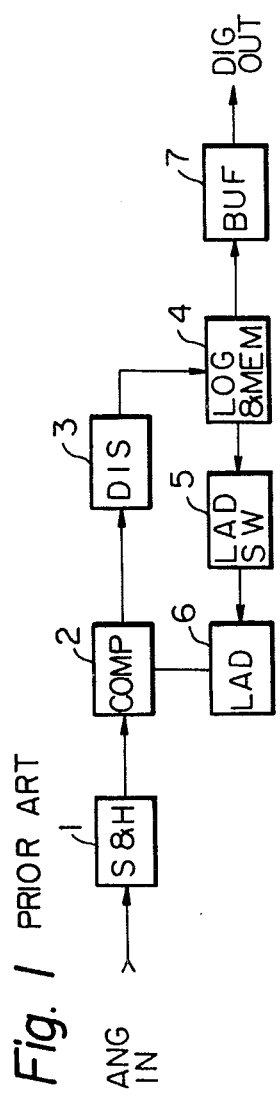
FIG. 1 is a block diagram of an encoder using a feedback A-D converter according to the prior art.

The conventional circuit for converting an analog signal into a digital signal by use of a feedback digital-to-analog ladder voltage network can be shown as in FIG. 1. In the circuit, numeral 1 indicates a sampling and holding circuit; numeral 2, a comparator circuit; numeral 3, a distributor; numeral 4, a logic and memory; 5, a ladder voltage change-over switch (hereinafter, referred to as a ladder switch); 6, a ladder voltage generating circuit (which is hereinafter referred to as a ladder circuit); and 7, a buffer circuit. In this circuit construction, the sampling and holding circuit 1 temporarily stores an analog input signal and holds it in the same condition until the corresponding digital signal is produced after terminating a first processing. The logic and memory circuit 4 produces a digital signal corresponding to a reference voltage to be compared with the analog input signal. The ladder circuit supplies the analog output to the comparator circuit 2 in accordance with a digital signal produced by the logic and memory circuit 4.

The circuit portion consisting of the ladder switch 5 and the ladder circuit 6 is called a local decoder. This portion produces an output in accordance with the signal from the logic and memory circuit 4 and supplies, to the input terminal of the comparator circuit 2, a reference voltage to be compared with the analog input. The comparator circuit 2 compares the output from the sampling and holding circuit 1 with the output from the ladder circuit 6 and when, for instance, the output from the circuit 1 is larger than that from the circuit 6 (for example, larger than $\frac{1}{2}$), a binary output "1" is produced, and when the output is smaller than that from the circuit 6 (that is, smaller than $\frac{1}{2}$), the binary "0" is produced. The logic and memory circuit 4 holds the binary outputs of the comparator circuit 2 and produces the next reference value (for example, $\frac{3}{4}$ or $\frac{1}{4}$ in accordance with the fact of whether or not the previous output was larger or smaller than $\frac{1}{2}$). Likewise, either a pair of values $\frac{7}{8}$, $\frac{5}{8}$ or $\frac{3}{8}$, $\frac{1}{8}$ is selected in accordance with the result of the next comparison, and one of these values is further compared with the input signal. In the case of a three-bit A-D converter, an analog signal is converted into a three-bit digital signal, and the output is produced through the buffer 7.

Figure 2:
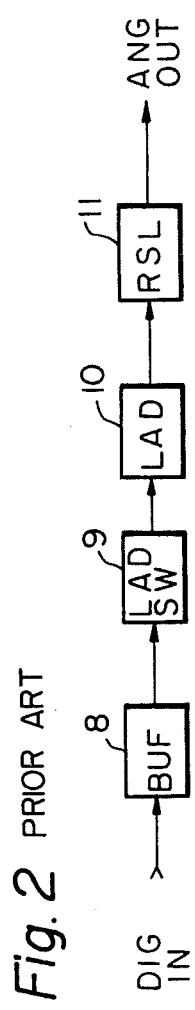
FIG. 2 is a block diagram of a decoder according to the prior art.

FIG. 2 shows a conventional D-A converter circuit block diagram. In this circuit, numeral 8 is a buffer circuit; 9, a ladder switch; 10, a ladder circuit; and 11, a resampling circuit. The ladder switch 9 and the ladder circuit 10 produce, in cooperation, an analog output signal in accordance with the incoming digital signal. The switch 9 and the ladder circuit 10 are the same components as those of the circuits 5 and 6 in FIG. 1.

Figure 3:
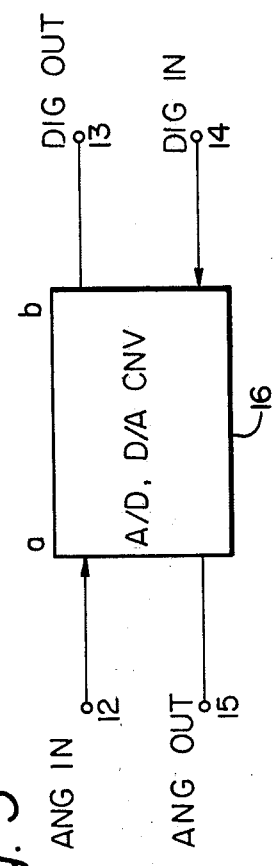
FIG. 3 shows the basic circuit principle of an A-D/D-A converter.

FIG. 3 shows a combined block circuit 16 of the A-D/D-A converter. In this circuit, an analog signal applied to the input terminal 12 is converted into a digital signal by the A-D converter circuit portion and the converted digital signal is produced at the output terminal 13. Conversely, the digital signal applied to the input terminal 14 is converted into an analog signal by the D-A converter circuit portion in the block circuit 16 and provided at output terminal 15. Thus, the unification of the ladder circuits 6, 10 and the ladder switches 5, 9 in the A-D converter and the D-A converter enables the combined circuit construction of A-D/D-A converters to be simplified, thus leading to economy of the converter. When the sampling period of the analog input and that of the digital input are completely in phase (this is referred to as a synchronous system hereinafter), various converting systems for adapting the A-D and D-A converters have been heretofore proposed.

Figure 4:
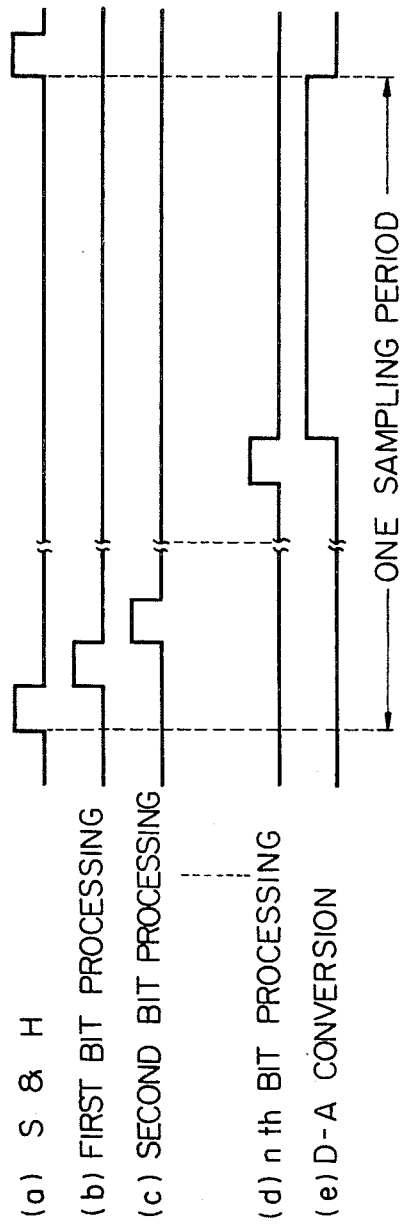
FIG. 4 is a timing chart of a synchronous A-D/D-A converter according to the prior art.

FIG. 4 shows the timing chart of the operation of the combined A-D/D-A converter in the synchronous system.

In this synchronous system, one sampling period is divided into two equal processing periods, in which the encoder portion of a converter circuit is operated in the first half part of the cycle as the A-D converter, and a decoder circuit portion is operated in the second part of the cycle as the D-A converter. Accordingly, in this case, it is necessary for the D-A converting process to terminate in the half time of the one sampling period, so that the operating time of each feedback loop becomes twice as long as the operating time of the circuit which operates only as a normal A-D converter. In this sense, requirements as to the encoder and decoder become strict. However, the merits in making the local decoder small in size by the unification of the ladder circuit portion and the ladder switching portion are higher than those of the former one.

Particularly, when the converter is used as a one-channel code converter of a channel portion in the transmission line so as to combine an analog voice channel and a digital channel, the problem of requiring the operation time to be twice as long due to doubled conversion time is not such an important one; however, the merits of making the decoder in a smaller size are much more important. In this way, in the encoder and the decoder according to the synchronous system, the local decoder of the A-D/D-A converters can be used on a time-sharing basis by fixedly allotting in advance each operating time of the A-D and D-A converters within the one sampling period. However, in the case of asynchronous analog and digital signals, the above modified system is no longer applicable.

Therefore, in cases where it is necessary to operate the A-D/D-A converter asynchronously, the purpose of the present invention is to provide an asynchronous signal processing circuit having a common ladder voltage generating circuit, in which, even if the phase and/or period between the analog input signal and the digital input signal differ from each other, the A-D converter and the D-A converter in the A-D/D-A converters will operate independently.

According to the invention, some marginal time slots are allotted to the sampling period of the A-D/D-A converting times, respectively, and a phase difference between the A-D converting operation and the D-A converting operation is adjusted thereby. Moreover, the operation of the encoder is interrupted when the decoder circuit is to be operated.

In the embodiment of the asynchronous signal processing circuit device according to the present invention, for the purpose of simplifying the explanation, the operating period for one cycle of the feedback loop of the A-D converter is given as the minimum time unit, i.e., one time slot.

In the embodiment, one sampling period can be divided into $A+B+C+D$ time slots, where A is the time slot allotted for holding the sampled signal of the encoder.

In an explanation hereinafter the equation $A=1$ is used. However, the equation $A=0$ wherein no time slot is required may also be used. B is the feedback operation time of the A-D converter. For instance, when an analog signal is to be converted into an 8-bit digital signal, eight feedback operation time slots are required. C is the time necessary for the operation of decoding in the D-A converter. Since the A-D converter and the D-A converter in the signal processing circuit operate asynchronously, the time duration of the D-A converter is decided according to the length of time calculated with respect to the number of time slots in the A-D converter.

D is a unique time slot which is allotted for adjusting the phase difference between the two A-D and D-A converters. In this period, the D-A converter substantially does not operate. D is, at least and in most cases, equal to 1.

Figure 5:
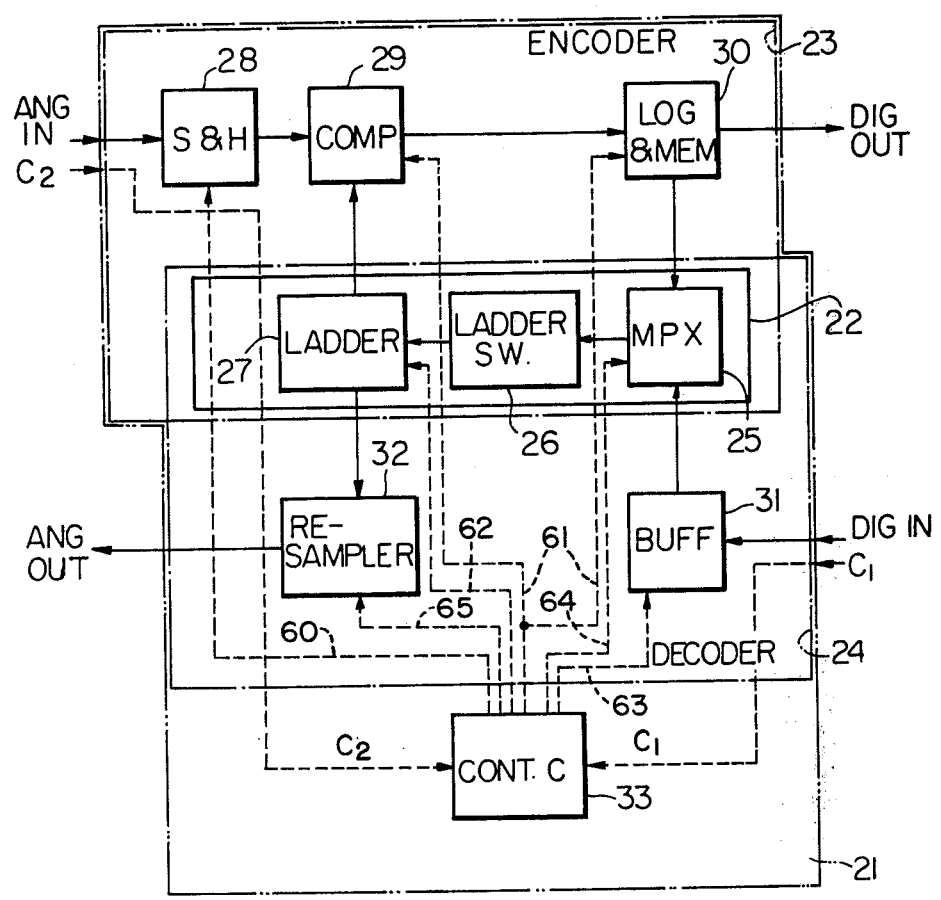
FIG. 5 is an embodiment of an asynchronous signal processing circuit according to the present invention.

Referring now to FIG. 5, the reference numeral 21 designates an encoder/decoder. The numeral 22 designates a ladder voltage generator circuit, and the numeral 23 an encoder. The numeral 24 designates a decoder. The numeral 25 designates a multiplexer. This is for selecting either one of the two given signals. The numeral 26 designates a ladder switch corresponding to the blocks 5 and 9 in FIGS. 1 and 2, respectively, for selectively turning on one of a plurality of switches corresponding to a digital signal supplied through said multiplexer 25. The numeral 27 designates a ladder circuit corresponding to the blocks 6 and 10 in FIGS. 1 and 2, respectively, and 28, a sampling and holding circuit for sampling an analog input and for holding the sampling result. The reference numeral 29 designates a comparator circuit for comparing the level of the analog signal held in said sampling and holding circuit 28 with that of an output from said ladder circuit 27 and for delivering the comparison result to the next stage 30. The numeral 30 designates a logic/memory circuit for receiving the result of the comparison by said comparator circuit 29 and for executing the processing which will be explained later with reference to FIG. 7. The block 31 is a buffer register for temporarily holding a supplied digital input, and 32, a resampler which delivers an analog output corresponding to the output from said ladder circuit 27. The reference numeral 33 designates a control clock source. This is to receive external clock pulse C1 or C2 and to issue control signals as shown by the dotted lines in FIG. 5.

Also, the solid lines indicate flows of signals to be processed, while the dotted lines indicate the flow of control signals. In the circuit in FIG. 5, the ladder circuit portion 27 and the ladder switch portion 26 of the encoder 23 and local decoder 24 (i.e., the A-D converter and the D-A converter) are used jointly, that is, on a shared basis.

The input to the ladder switch 26 is derived from the multiplexer 25, the output of the buffer circuit 31 being applied to the multiplexer 25. The output from the ladder switch 26 is applied, via the ladder circuit 27, to both the comparator circuit 29 and the resampler circuit 32.

Figure 5A:
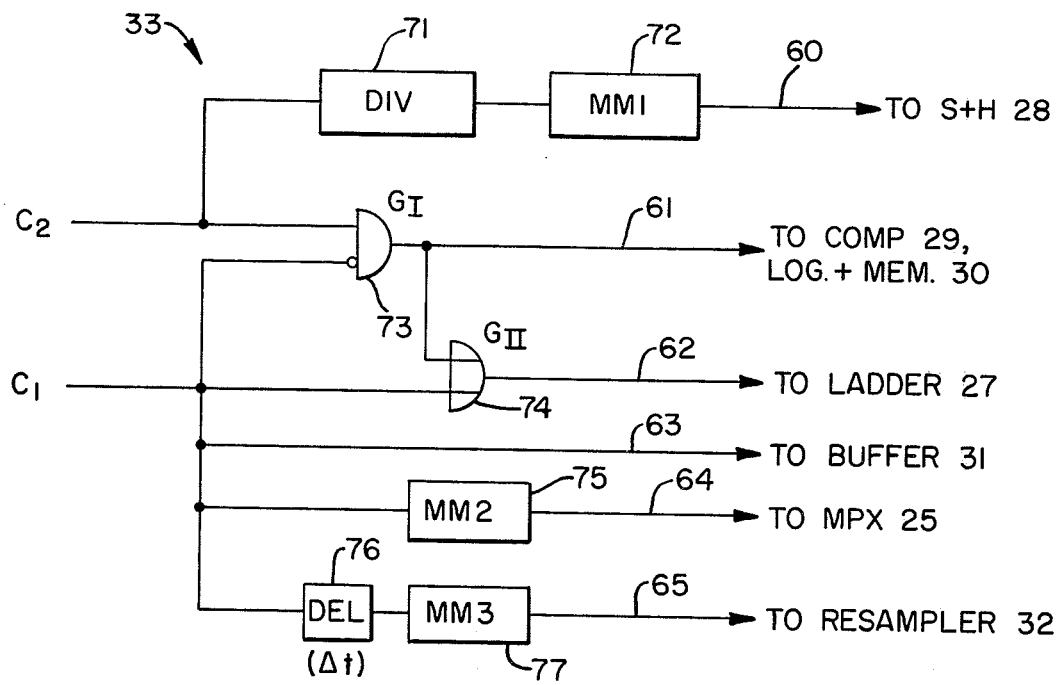
FIG. 5A is an embodiment of the control clock circuit 33 of FIG. 5.
Figure 6:
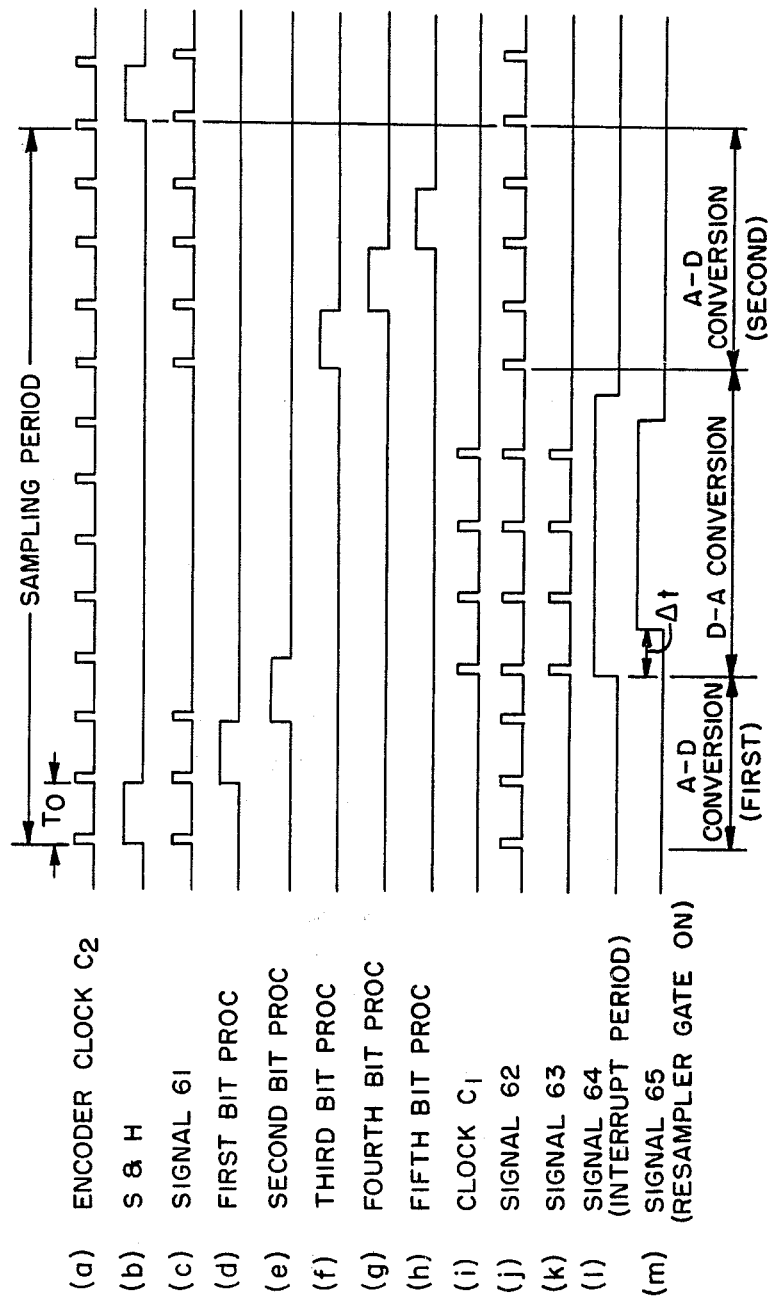
FIG. 6 is an operational timing chart of the circuit shown in FIG. 5.

FIG. 5A is one embodiment of the control clock circuit 33 shown in FIG. 5, and FIG. 6 is a timing chart of the operations and control signals of the circuits of FIGS. 5 and 5A.

Referring to FIG. 5A, the control clock pulse $C_2$ — also known as the encoder clock (see FIG. 6(a)) — is continuously generated and supplied to the control clock circuit 33, so as to control the functions of digital-to-analog and analog-to-digital conversion. On the other hand, the clock pulse $C_1$ (see FIG. 6(i)) which is supplied to the control clock circuit 33, is generated and supplied only when the circuit 21 shown in FIG. 5 is used for digital-to-analog conversion.

The clock pulse signal $C_2$ (FIG. 6(a)) is provided to a frequency divider 71 and a monostable multivibrator 72, and is thus converted to a sample and hold control signal 60 which is provided as a control input (FIG. 6(b)) to the sampling and holding circuit 28. The signal 60 corresponds to a sampling signal in the sampling and holding circuit 28.

The clock signal $C_2$ is also supplied, via a gate 73, to the comparator circuit 29 and the logic/memory circuit 30 (FIG. 5) as a signal 61 (FIG. 6(c)) during the time the clock signal $C_1$ is not generated. The clock pulse $C_1$ (FIG. 6(i)) is supplied to the inhibit terminal of the gate 73, so that the output signal 61 of the gate 73 is inhibited when the circuit 21 (FIG. 5) is used as for digital-to-analog conversion.

The output of the gate 73 and the clock signal $C_1$ are supplied to an OR gate 74. Thus, the output signal 62 of the OR gate 74 is the clock signal $C_2$ when the circuit 21 shown in FIG. 5 is used as an analog-to-digital converter, and is the clock signal $C_1$ when the circuit 25 is used as a digital-to-analog converter (see FIG. 6(j)).

The clock signal $C_1$ is directly supplied to the buffer register 31 as control signal 63, shown in FIG. 6(k).

The signal $C_1$ —shown in FIG. 6(i) —is supplied, via monostable multivibrator 75, to the multiplexer 25 and defines an interrupt period. That is, the monostable multivibrator 75 is triggered by a first pulse of the clock signal $C_1$, and the pulse waveform 64 is formed. Pulse waveform 64 has a pulse width corresponding to an interrupt period, the function of which will be later explained.

Delay circuit 76 and a monostable multivibrator 77 receive clock signal $C_1$, and produce pulse waveform 65 (FIG. 6(m)) which is applied to resampler 32. That is, the first pulse of the clock signal $C_1$ is delayed in the delay circuit 76 by an amount Δt, and is then supplied to the monostable multivibrator 77, where the pulse waveform 65 is formed and supplied to the resampler 32 to define a resampling period. In the resampler 32 (FIG. 5), the analog signal from the ladder circuit 27 is resampled during this resampling period, and the resampled signal is sent out as analog output.

By use of the above-mentioned signals 60 through 65, generated by control clock 33 (FIG. 5), the circuit 21 functions in a synchronous manner to perform analog-to-digital conversion during a first period, (shown in FIG. 6), corresponding to first and second bit processing periods (FIGS. 6(d) and 6(e)), and performs analog-to-digital conversion during a second period corresponding to third, fourth and fifth bit processing periods (FIGS. 6(f), 6(g) and 6(h)). In the interrupt period, between the first and second perods, digital-to-analog conversion is carried out synchronously by the circuit under the control of clock signal $C_1$.

Referring to FIGS. 6(d) through (h), each indicates a respective A-D converting process in the A-D converter, FIG. 6(l) is an interrupt pulse waveform of the D-A converter which requires a D-A conversion, and FIG. 6(m) is a gate-on pulse for actuating the resampler circuit 32 shown in FIG. 5. The pulses of FIGS. 6(l) and (m) are in asynchronization with the clock pulse of FIG. 6(a) since an interrupt signal comes at an arbitrary time, so that the A-D converting function is immediately stopped. In FIG. 6, the interruption from the decoder side (i.e., the D-A converter) begins between the third time slot and the fourth time slot of the clock of the encoder (i.e., the A-D converter side) and terminates between the eighth time slot and the ninth time slot. Accordingly, the function of the A-D converter is stopped during the five time slots from the fourth through the eighth time slots. This function will now be explained in conjunction with the block diagram of FIG. 5.

The multiplexer 25 enables a signal from the logic and memory circuit 30 to be applied to the ladder switch 26 during the first three time slots, such that the operation of the A-D converter is the same as that of the normal conventional converter. When the interrupt signal 64 is applied to the multiplexer circuit 25 between the third time slot and the fourth time slot, the multiplexer 25 is controlled so as to apply the digital signal from buffer 31 to the ladder switch 26, and the circuit operates as a normal D-A converter. At some time Δt after the fourth time slot (i.e., between the fourth and fifth time slots), signal 65 (FIG. 6(m)) enables the resampler 32 to perform its resampling function with respect to ladder circuit 27, whereby to provide an analog output as a final step of the D-A conversion process.

It should be noted that, when interrupt signal 64 causes commencement of the D-A conversion process, the converting process of the A-D converter must be frozen or maintained in the same condition. At the same time, the control signal 61 to the logic and memory circuit 30 is stopped (see FIG. 6(c)). In this case, however, it should be noted that, for the purpose of completely stopping the control signal 61 at the fourth time slot, it is possible to design the circuit in such a way that incoming signals are delayed by the control clock source 33 for a time duration equal to one time slot pulse, within which it is decided whether or not the D-A converter interrupt signal should be entered.

When an interruption by the D-A converter overlaps into the time slot of the sampling and holding function of the A-D converter, the sampling and holding function of the A-D converter is maintained with the D-A conversion having a higher priority. In the other time slots, the function of the D-A conversion has priority. However, when the interrupt signal is entered in the middle of the time slot, all of the time slots are used in the D-A converter. In this case, there exists a time slot during which both the A-D converter and D-A converter do not function. In order to adjust a phase difference due to the asynchronization, an extra time slot D is provided. Amoung the A, B, C and D time slots, selection of the value of C and D time slots depends on factors such as the A-D converter speed and the nature of the D-A converter output. When an n-bit code conversion has to be performed, the time slots of $A=D=1$, $B=C=n$ can be determined as the time slots similar to the synchronous system. In a particular case such as synchronous, $A=1$, $B=n$, $C=n+1$, $D=0$ are selected.

In the above explanation, the common circuit portion is seen to be only the local decoder portion. However, when a non-linear encoder having a D-D converter circuit is used, which circuit is provided between the logic and memory circuit and the ladder circuit, a part of that D-D converter circuit can also be jointly used. Moreover, the value of the interrupt time is not necessarily an integral number of one time slot of the A-D converter.

Now, the asynchronous signal processing circuit device will be briefly described with reference to the case where said circuit serves as an encoder and to the case where said circuit functions as a decoder, respectively.

The case where an asynchronous signal processing circuit device functions as an encoder will be first explained. When an analog signal is supplied to the encoder, the signal is held in the sampling and holding circuit 28.

Figure 7:
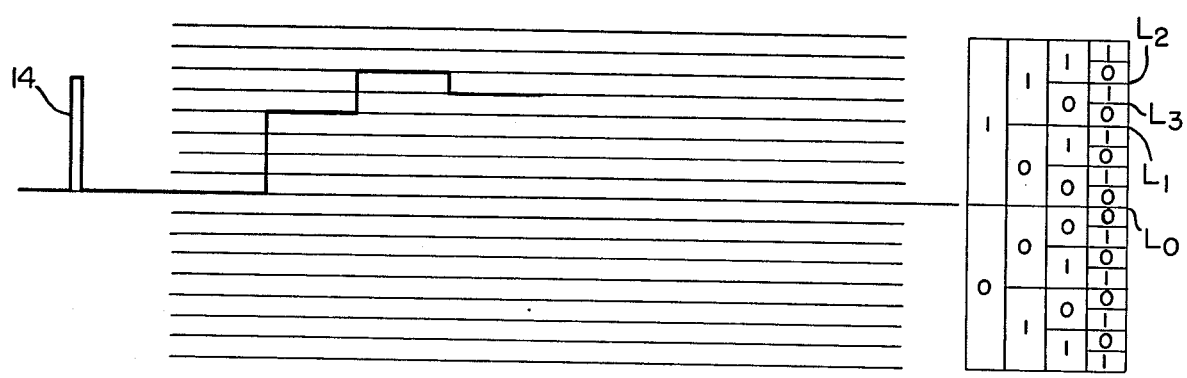
FIG. 7 is a functional diagram of a ladder voltage generator circuit according to the present invention.

Assume that the level of the signal amplitude at this particular time is at the level 44 as shown in FIG. 7. The logic/memory circuit 30 initially supplies the multiplexer 25 with a digital signal to produce a level L0 shown in FIG. 7. Then, the ladder switch 26 operates so as to generate to the ladder circuit 27 analog signals representing a level L0, and the circuit 27 generates an analog output which corresponds to said signal of level L0. As a result, the comparator circuit 29 compares the output from the sampling and holding circuit 28 with said analog signal of level L0, and issues a signal of logic "1" when the level of the former is higher. The logic signal thus obtained is fed to the logic/memory circuit 30 which in turn is connected to the multiplexer 25 so that a signal of level L1 may be generated by the ladder circuit 27. Thus, the comparator circuit 29 delivers a signal of logic "1" again. The result will be transmitted to the logic/memory circuit 30 which in turn will designate a signal of level L2. At this time, the comparator circuit 29 delivers a logic "0" which is delivered to the logic/memory circuit. Thus, said circuit 30 next designates a signal of level L3. Similar processing operations will be made subsequently in sequence until the analog signal held by the sampling and holding circuit 28 is digitally encoded and at last delivered from the logic/memory circuit 30 to the output DIG OUT.

When the asynchronous signal processing circuit serves as a decoder, however, a supplied digital signal input DIG IN is transmitted through the buffer register 31 and multiplexer 25 to the ladder switch 26.

Then, said change-over switch 26 turns on a predetermined switch so that an analog signal of the level of amplitude corresponding to the supplied digital input may be generated in the ladder circuit 27. The resampler 32 resamples the output from said ladder circuit 27 and delivers it as an analog output.

In the encoder/decoder 21 constructed according to the present invention, priority is given to the decoder side. Referring again to FIG. 6, it is indicated that the asynchronous signal processing circuit is requested to operate as a decoder at the time when a signal has been encoded up to the second bit by the asynchronous signal processing circuit acting as an encoder, the encoder having operated synchronously with the encoder clock pulse $C_2$ to execute the processings of the first bit and second bit.

When the circuit is required during this particular time to serve as decoder, an interrupt period occurs as a result of signal 64. During this interrupt period, the circuit acts as a decoder. Upon completion of the decoding operation, the processing circuit resumes the function of an encoder and processes the remaining bits (third, fourth and fifth bits).

As an encoder, the asynchronous signal processing circuit stores in a flip-flop, or the like, the result of the comparison made by the comparator circuit 29 during one feedback processing operation (this will be referred to as COMP processing hereafter), advances by one step a counter which counts the number of processing times in the comparison processing loop (which will be referred to as COUNTING processing), and sets the logic/memory circuit 30 into operation (this will be referred to as LOGIC processing). The phases with which these three processing operations are performed may be separately arranged.

If the operation of the encoder is generally impaired by an interrupt in the case wherein a ladder voltage generator is jointly used for the above processing operations, it is necessary to determine which one of the three processing operations has been impaired, and to set up a phase for the resumption of that processing operation after the interrupt has terminated. To this end, in the embodiment described below, the asynchronous signal processing circuit has set, within one-phase period, two phase positions Ca and Cb. With reference to the time chart in FIG. 8, the COMP and COUNTING operations are performed at the phase position Ca, while the LOGIC operation is performed at the phase position Cb. in this case, although a failure may occur due to a delicate phase difference (which will be described later), at whichever phase an interrupt occurs —that is, irrespective of the condition of the circuit when impairment occurred —the processing operation, after the circuit is again activated, can be corrected by eliminating the interrupt status at the phase position Cc, which first appears after an interrupt end, or interrupt completion, signal te has been applied. In the following, the embodiment of an encoder with such phase relation will be described for facilitating the understanding of the present invention.

It should be noted here that the clock pulse for the functioning of encoder section 23 of the encoder/decoder 21 is completely asynchronous with that for the functioning of decoder 24. For this reason, there is a chance for the rise of the signal t1 (requesting the start of interrupt from the decoder section) to take place with a phase similar to that of the rise of the timing pulse Ca. In such case, most of the period during which the timing pulse lasts is masked by the interrupt signal Sw, thereby resulting in a timing pulse of extremely narrow width. When this pulse is used as a clock pulse, only one of the COMP and COUNTING processing operations may be performed, and the other operation may be not conducted, thus creating a disadvantage. If this condition occurs, the further processing to be actually performed when the circuit resumes the function of an encoder is erroneously resumed and the subsequent encoding operation may not be correctly performed.

Figure 8:
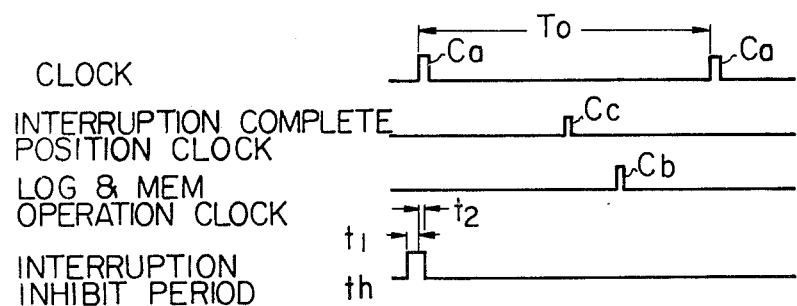
FIG. 8 is an operational timing chart illustrating an inhibit period according to the present invention.
Figure 9:
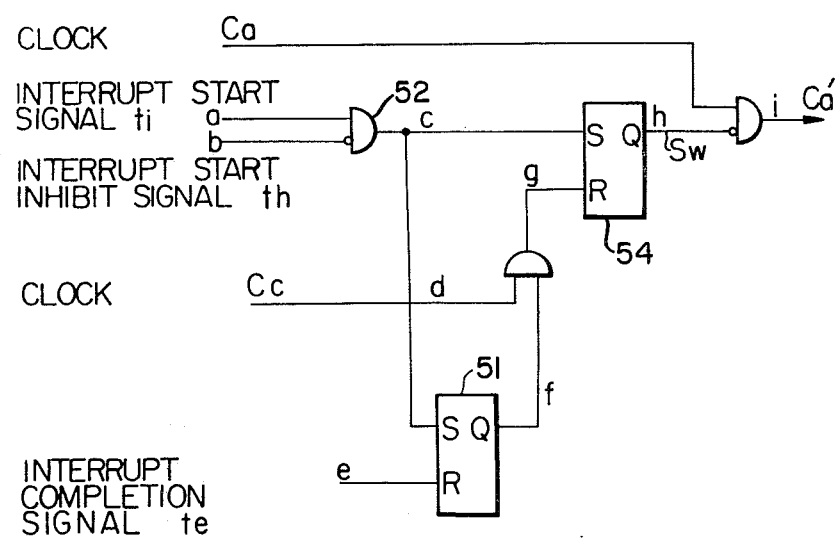
FIG. 9 is a block diagram of an interrupt signal generator circuit.

To avoid this, according to the present invention, there is provided a predetermined interrupt-inhibit period as shown in FIG. 8. Here, the means to develop a signal Sw representing an interrupt period will be explained with reference to FIG. 9 which is a block diagram of an interrupt signal generating circuit. In FIG. 9, the reference symbol ti indicates an interrupt start signal, which is input at the terminal a of the gate 52; th indicates an interrupt start inhibit signal which is input at the other terminal b of the gate 52; Ca and Cc indicate timing clock pulses; te indicates an interrupt end or completion signal input at terminal e of latch circuit 51; Sw indicates an interrupt period signal; and Ca' indicates a processing signal for the encoder. This processing signal Ca' is jointly used for storing the comparison result and for counting the number of loop processing times. In FIG. 9, the reference symbols ti and te show signals synchronous with the decoder section, and Ca, Cc and th are signal synchronous with the encoder section. The pulse th covers the period tl (FIG. 8) immediately before the rise of Ca and the period t2 just after the rise of Ca. While th is "1," when an interrupt start signal ti is provided at the terminal a, the signal is blocked by the gate 52 and prevented from reaching the setting terminals of the latch circuits 51 and 54. In such case, even when the phase relation in rise between the pulses ti and th becomes delicate and a signal of an extremely narrow width reaches the point c, which makes the operation of the latch circuit 54 uncertain, no failure is caused by making the duration of the pulse ti long enough to place the latch circuit 54 in the set condition after th disappears, and by making the duration of t2 long enough for the pulse Ca to act sufficiently as a pulse signal. Assume that the time required for the above-mentioned pulses, to assure the operation of the latch circuit 51 and 54, is t3 and that the duration of a pulse ti is made longer than t1+t2+t3. Irrespective of the phase relation between ti and th, once a pulse ti has taken place, the interrupt starts without failure either before the processing operation with Ca' is performed or after the operation has been correctly carried out. By providing a sufficient period from the occurrence of ti on the decoder side until the pulse opens the gate of the resampler 32 (FIG. 5), the operation of the decoder section may not be degraded although the interrupt period has been delayed on the order of th. When the latch setting signal developing at the terminal c has a narrower width, there is the possibility that the latches 51 and 54 (FIG. 9) are set before and after the point ca'. Since the latch 51 is used only to reset the latch 54, however, such possibility is negligible if it occurs. By setting the signal th, the inoperability during the interrupt period will occur without fail when the COMP and COUNTING processing operations are over, or upon the completion of the LOGIC processing operation. By resetting the latch circuit 54 with the first signal Cc after the signal te has occurred as previously mentioned, the processing operation can be correctly carried out after resumption of the operation.

In the foregoing embodiment, an explanation is made of the case where the COMP and COUNTING processings are performed with the signal Ca, and the LOGIC processing is conducted with the signal Cb. Also, when the present invention is designed so as to have a phase relation different from that of the above, the processing operation can be correctly and easily resumed after the end of the interrupt period by setting up an inhibit period equivalent to the duration of signal th.

As seen in the foregoing, the present invention permits the joint use of the ladder voltage generator circuit 22 without any undesirable interference occurring between the function as encoder and the function as decoder.

Figure 10:
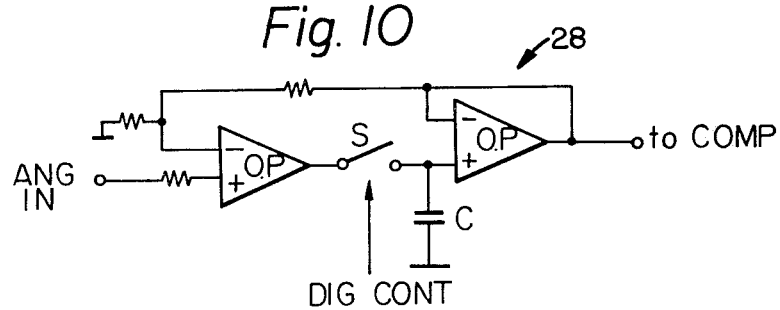
FIG. 10 is an example of a detailed circuit of the sampling and holding circuit of FIG. 5.

FIG. 10 shows a detailed circuit of the sampling and holding circuit 28 of FIG. 5 in which OP indicates an operational amplifier, and C is a capacitor for storing a sampled wave each time switch S is closed.

Figure 11:
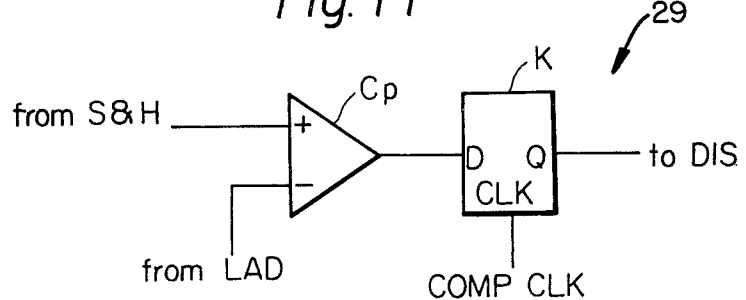
FIG. 11 is a detailed drawing of the comparator circuit of FIG. 5.

FIG. 11 shows a detailed circuit of the comparator 29 of FIG. 5 which is well-known to those skilled in the art. Reference character CP designates a comparing circuit, and reference character K designates a latch circuit. A detailed explanation of the comparator 29 will not be necessary here.

Figure 12:
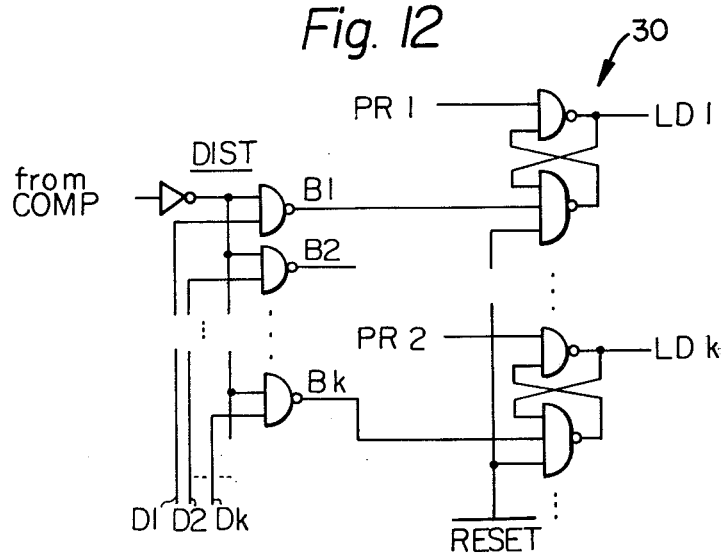
FIG. 12 is a detailed drawing of the logic and memory of FIG. 5.

FIG. 12 shows a detailed circuit of the logic and memory circuit 30 having a distributor section (DIST) (corresponding to that indicated by block 3 of FIG. 1) which comprises a number of NAND circuits.

Figure 13:
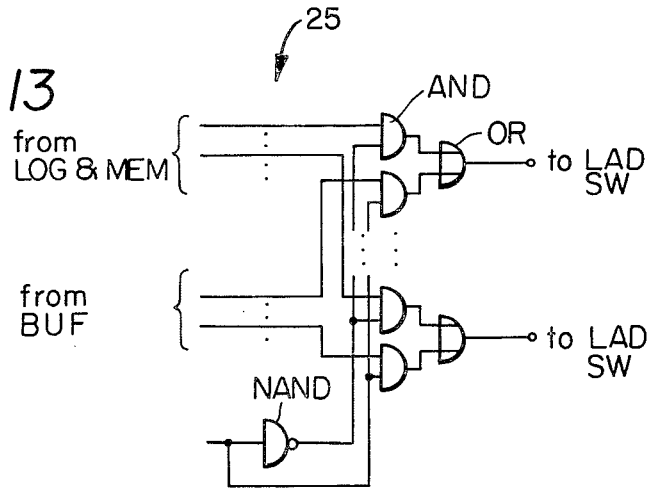
FIG. 13 is a detailed drawing of the multiplexer circuit of FIG. 5.

FIG. 13 shows a detailed circuit for realizing the multiplexer 25 of FIG. 5.

Figure 14:
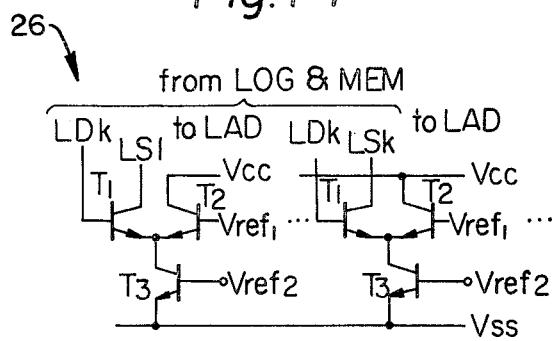
FIG. 14 is a detailed drawing of the ladder switch circuit of FIG. 5.
Figure 15:
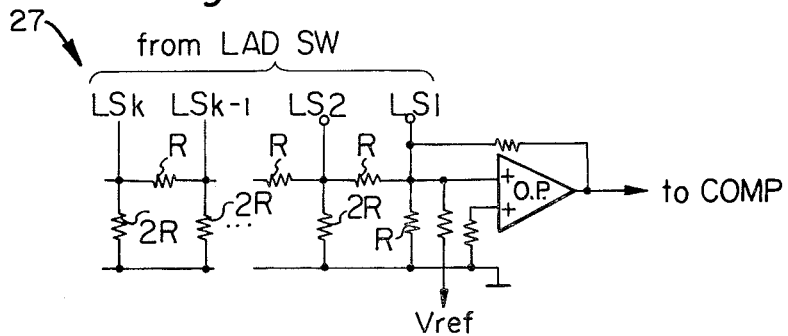
FIG. 15 is a detailed drawing of the ladder circuit of FIG. 5.

FIG. 14 and FIG. 15 constitute a ladder voltage generator consisting of a ladder switch 26 (FIG. 14) and a ladder circuit 27 (FIG. 15). The ladder switch in FIG. 14 comprises three transistors, $T_1$, $T_2$ and $T_3$ for each stage. This is not a novel circuit so that a more detailed explanation will not be necessary here. The ladder circuit in FIG. 15 is also a conventional circuit.

Figure 16:
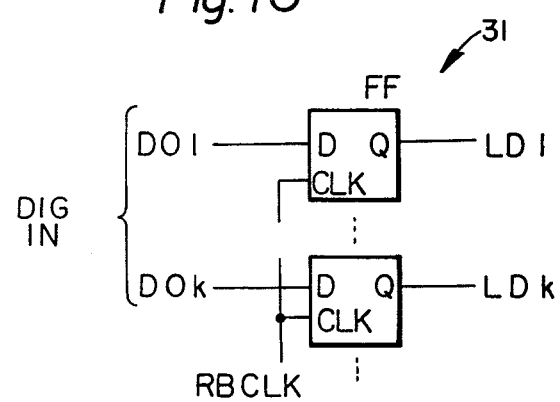
FIG. 16 is a detailed drawing of the buffer circuit of FIG. 11.
Figure 17:
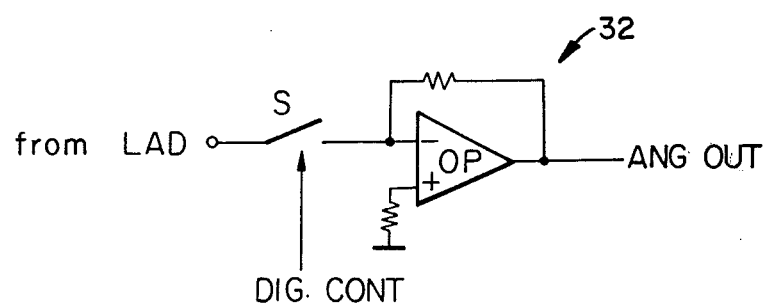
FIG. 17 is a detailed drawing of the resampling circuit of FIG. 5.

FIG. 16 shows an example of the buffer circuit 31 (of FIG. 5) which comprises one flip-flop for each stage. FIG. 17 shows a detailed circuit of the resampler circuit 32 (of FIG. 5) in which OP indicates the operational amplifier for producing an analog signal each time the switch S is closed by clock pulses.

Figure 18:
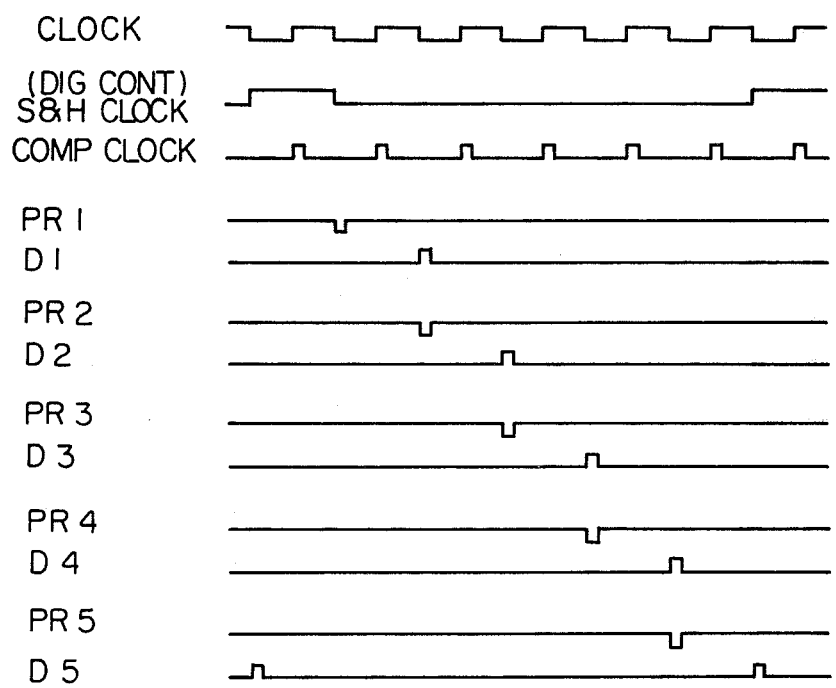
FIG. 18 is a timing chart illustrating a time relationship among the circuits.

FIG. 18 shows control clock pulses from the control clock source 33, which source controls each of the circuit sections 25 through 32. In this case, the timing chart shows timing for a 5-bit enclocder of the feedback type having processing times $PR_1$–$PR_5$ and phase adjustment times $D_1$–$D_5$.

As stated in the foregoing, in the asynchronous signal processing circuit according to the present invention, an interruption inhibit signal is provided so as to inhibit an interruption of the D-A converter during a particular time period when the A-D converter is being operated, thus preventing an undesirable change-over from A-D conversion to D-A conversion.

We claim:

1. An asynchronous signal processing circuit device comprising a first signal processing circuit means for performing a first mode conversion and a second signal processing circuit means for performing a second mode conversion, said device including voltage generating means jointly used on a time-shared basis by said first and second signal processing circuit means during said first mode conversion and during said second mode conversion, respectively, for generating voltage signals having a value corresponding to digital values generated in said first and second signal processing circuit means, respectively; and device also including a control clock source for controlling the respective operations of said first and second signal processing circuit means and responsive, during the operation of said first signal processing circuit means, to an interrupt signal, for stopping said first mode conversion and starting said second mode conversion; said device also including multiplexer means for selectively controlling the use of said voltage generating means by said first and second signal processing circuit means, respectively, said first signal processing circuit means performing said first mode conversion during a time interval defined as one sampling time period, said control clock source including means for defining a marginal time slot within said one sampling time period, and means for compensating, during said marginal time slot, for asynchronism between said first mode conversion and said second mode conversion during change-overs from said first mode conversion to said second mode conversion.

2. An asynchronous signal processing circuit device according to claim 1, wherein said circuit device further comprises an interrupt signal generating circuit means for generating said interrupt signal, and including means for producing an inhibit signal so as to provide a predetermined inhibit period during which the interruption of the first signal processing circuit means by the second signal processing circuit means is inhibited.

3. An asynchronous signal processing circuit device according to claim 1, wherein said first signal processing means is an analog-to-digital converter, and said second signal processing circuit means is a digital-to-analog converter.

4. An asynchronous signal processing circuit comprising, in combination:

an encoder which includes input means for receiving an analog signal input having a given amplitude level, comparing means for comparing said given amplitude level with a reference amplitude level approximating said given amplitude level and producing a first digital output when said given amplitude level exceeds said reference amplitude level and a second digital output when said reference amplitude level exceeds said given amplitude level, and logic means responsive to said first and second digital outputs, respectively, from said comparing means for issuing a digital signal corresponding to an analog signal of amplitude level higher and lower, respectively, relative to said reference amplitude level;

a local decoder which includes means for receiving a digital input and for converting same to a corresponding analog output, and including multiplexer means connecting said logic means of said encoder to said receiving and converting means during an encoding period for providing said digital signal from said logic means to said receiving and converting means, said receiving and converting means converting said digital signal from said logic means to said corresponding analog signal and being connected to said comparing means so as to provide said corresponding analog signal thereto, thus adjusting said reference amplitude level of said comparing means;

a decoder which includes additional input means for receiving a digital signal input, said circuit device including means for providing an interrupt signal defining the beginning of a decoding period, said multiplexer means of said local decoder being actuable, in response to said interrupt signal, for providing said digital signal input received by said input means of said decoder to said receiving and converting means which converts said digital signal input to a corresponding analog output, said decoder including means connected to said receiving and converting means for providing said corresponding analog output as an analog decoder output; and control means for issuing control signal to said encoder, decoder and local decoder, respectively, and defining said encoding and decoding periods, and including means for providing said interrupt signal to said multiplexer means, said control means including means for establishing a marginal time slot within said encoding period, and means for adjusting the timing of said respective encoding and decoding periods to compensate for asynchronism between the respective operations of said encoder and decoder.

5. The circuit as recited in claim 4, said circuit device including means for producing an inhibit signal so as to provide a predetermined inhibit period during which the generation of said interrupt signal is inhibited.

6. An asynchronous signal processing circuit comprising, in combination:

an encoder for receiving an analog signal input having a given amplitude and for converting the same to a corresponding digital signal which consists of a predetermined number of digits within an encoding period, each encoding period comprising a plurality of time slots, said encoder including means for receiving said analog signal input having a given amplitude level, comparing means for comparing said given amplitude level with a reference amplitude level at which time slot of said encoding period and producing a first digital output when said given amplitude level exceeds said reference amplitude level and a second digital output when said reference amplitude level exceeds said given amplitude level, and logic means responsive to said first and second digital outputs, respectively, from said comparing means for issuing a digit which forms one of said predetermined number of digits corresponding to said analog signal of an amplitude level higher and lower, respectively, relative to said reference amplitude level;

a local decoder which includes means for receiving a digital input and for converting the same to a corresponding analog input, and including multiplexer means connecting said logic means of said encoder to said receiving and converting means during said encoding period for providing said digit from said logic means to said receiving and converting means as said digital input thereto, said receiving and converting means converting said digit from said logic means to corresponding said analog signal and being connected to said comparing means so as to provide corresponding said analog signal thereto as said reference amplitude level, thus adjusting said reference amplitude level of said comparing means;

a decoder which includes additional input means for receiving a digital signal input, said multiplexer means of said local decoder being actuable, in response to an interrupt signal defining the beginning of a decoding period, for providing said digital signal input from said decoder to said receiving and converting means, said receiving and converting means converting said digital signal input to corresponding said analog output, said decoder including means for receiving and providing said corresponding analog output as an analog decoder output; and control means for providing time slot signals to define said encoding and decoding periods, including means for providing at least one marginal time slot during one of said encoding and decoding periods, and means for adjusting the timing of said respective encoding and decoding periods to compensate for asynchronism between the respective operations of said encoder and decoder.

7. The circuit as recited in claim 6 wherein said control means further includes means for generating said interrupt signal to interrupt the operation of said encoder until such time as the operation of the decoder is completed.

8. The circuit as recited in claim 7 including means for producing an inhibit signal so as to provide a predetermined inhibit period during which the generation of said interrupt signal is inhibited.

9. The circuit as recited in claim 6 including means for producing an inhibit signal so as to provide a predetermined inhibit period during which the generation of said interrupt signal is inhibited.

10. The circuit as recited in claim 6 wherein said logic means includes means for storing said digit, in response to said interrupt signal, until the end of said decoding period.

* * * * *

UNITED STATES PATENT AND TRADEMARK OFFICE
CERTIFICATE OF CORRECTION

PATENT NO. :   4,160,243
DATED      :   July 3, 1979
INVENTOR(S) :  Moriya et al It is certified that error appears in the above-identified patent and that said Letters Patent are hereby corrected as shown below:

Col. 6, line 47, "perods" should be -- periods --;
Col. 7, line 41, "Amoung" should be -- Among --;
Col. 11, line 10, "encloder" should be -- encoder --.

Signed and Sealed this

Fourth Day of December 1979

[SEAL]

Attest:

SIDNEY A. DIAMOND

Attesting Officer

Commissioner of Patents and Trademarks